United States Patent [19]

Yanagi et al.

[11] Patent Number: 5,000,114
[45] Date of Patent: Mar. 19, 1991

[54] CONTINUOUS VACUUM VAPOR DEPOSITION SYSTEM HAVING REDUCED PRESSURE SUB-CHAMBERS SEPARATED BY SEAL DEVICES

[75] Inventors: Kenichi Yanagi; Toshio Taguchi; Hajime Okita; Heizaburo Furukawa; Susumu Kamikawa, all of Hiroshima, Japan

[73] Assignee: Mitsubishi Jukogyo Kabushiki Kaisha, Tokyo, Japan

[21] Appl. No.: 336,349

[22] Filed: Apr. 11, 1989

[30] Foreign Application Priority Data

| Apr. 11, 1988 | [JP] | Japan | 63-87306 |
| Apr. 21, 1988 | [JP] | Japan | 63-99038 |
| May 12, 1988 | [JP] | Japan | 63-113469 |
| Oct. 28, 1988 | [JP] | Japan | 63-270943 |

[51] Int. Cl.$^5$ .................................................. C23C 16/00
[52] U.S. Cl. ........................................ 118/733; 118/40; 118/718; 118/726; 427/177; 427/289
[58] Field of Search .............. 118/718, 726, 733, 39, 118/40, 41, 42; 204/298 SM, 298 MC, 298 MD; 427/177, 178, 179, 289, 290, 293

[56] References Cited

U.S. PATENT DOCUMENTS

| 2,853,047 | 9/1958 | Walter et al. | 118/718 |
| 2,975,753 | 3/1961 | Hayes | 118/718 |
| 2,989,026 | 6/1961 | Gardner et al. | 204/298 SM |
| 3,158,507 | 11/1964 | Alexander | 118/733 |
| 3,183,563 | 5/1965 | Smith | 164/506 |
| 3,329,524 | 7/1967 | Smith, Jr. | 118/726 |
| 3,365,992 | 1/1968 | Dreher | 118/42 |
| 3,683,847 | 8/1972 | Carleton | 118/718 |
| 3,860,444 | 1/1975 | Donckel et al. | 118/733 |
| 3,989,862 | 11/1976 | Butler et al. | 118/718 |
| 4,655,168 | 4/1987 | Shimozato et al. | 118/718 |

FOREIGN PATENT DOCUMENTS

| 2747061 | 4/1979 | Fed. Rep. of Germany | 118/718 |
| 1091369 | 5/1955 | France . | |
| 1407557 | 6/1965 | France . | |
| 2090343 | 1/1972 | France . | |
| 61-266572 | 11/1986 | France . | |
| 44-8330 | 4/1969 | Japan | 118/718 |
| 60-67657 | 4/1985 | Japan | 118/726 |
| 60-197872 | 10/1985 | Japan | 118/718 |
| 61-96071 | 5/1986 | Japan | 118/718 |
| 61-280027 | 12/1986 | Japan | 118/718 |
| WO82/02687 | 8/1982 | World Int. Prop. O. . | |

OTHER PUBLICATIONS

"Reactive Vapor Deposition Method of Multi-Element Compound", 61-3880, Jan. 1, 1986, (Japanese patent publication Abstract).
"Production of Flexible Conductive Film", 61-159569, Jul. 19, 1986, (Japanese patent publication Abstract).
"Sputtering Device", 61-266572, Nov. 26, 1986, (Japanese patent publication Abstract).
Official Gazette, Mar. 6, 1906, pp. 55–56.
The Official Gazette of the United States Patent Office, vol. 121, No. 1, Mar. 6, 1906 (p. 56).

*Primary Examiner*—Norman Morgenstern
*Assistant Examiner*—Terry J. Owens
*Attorney, Agent, or Firm*—Wenderoth, Lind & Ponack

[57] ABSTRACT

In a continuous vacuum vapor deposition system, a reduced-pressure chamber is partitioned into a plurality of sub-chambers by seal devices each formed by one set of three pinch rolls arrayed in parallel on one plane or a single seal roll, and a pair of seal bars positioned on the same plane on the respective sides of the pinch roll or seal roll. Gaps between the pinch rolls or seal roll and seal bars are adapted to allow the base plate portions on the inlet side and on the outlet side, respectively, to pass therethrough. In each of the reduced-pressure sub-chambers are disposed a pair of deflector rolls so that the base plate portions on the inlet side and on the outlet side may be wrapped respectively around the pinch rolls or seal roll with a wrapping angle of 10 degrees or more.

6 Claims, 6 Drawing Sheets

CONTINUOUS VACUUM VAPOR DEPOSITION SYSTEM HAVING REDUCED PRESSURE SUB-CHAMBERS SEPARATED BY SEAL DEVICES

BACKGROUND OF THE INVENTION

1. Field of the Invention

The present invention relates to a vacuum vapor deposition system for vapor-depositing metal such as aluminium or the like or non-metal such as ceramics or the like onto a plastic film such as, for example, a film of polyester or the like or onto a paper sheet, and a vacuum vapor deposition system for vapor-depositing metallic material or non-metallic material onto a substrate of various non-metallic materials other than plastics or various metallic materials.

2. Description of the Prior Art

Heretofore, vacuum vapor deposition onto a plastic film, a paper sheet and the like has been carried out according to a batch system, but a continuous vacuum vapor deposition system in which a base plate is continuously carried into a vacuum vapor deposition apparatus has not been put to practical use. For reference, a continuous vacuum vapor deposition system for dealing with a steel sheet in the prior art is illustrated in FIG. 9 and will be described in the following.

In FIG. 9, reference numeral 001 designates a base plate, numerals 002a, 002b, 002c, ... designate inlet side seal rolls, numerals 003a, 003b, 003c, ... designate outlet side seal rolls, numerals 004a, 004b, 004c, ... designate vacuum pumps, numeral 005 designates a vapor deposition apparatus, numerals 006a, 006b, 006c, ... designate pressure chambers, numeral 007 designates a vapor deposition chamber, numeral 008 designates deflector rolls, and numeral 009 designates a wrapping roll.

The base plate passes through the pressure chambers 006a, 006b, 006c, ... partitioned by seal rolls 002a, 002b, 002c, ... each consisting of a pair of pinch rolls, then reaches the vapor deposition chamber 007 held at a predetermined degree of vacuum, and after it has been plated by vapor deposition by means of the vapor deposition apparatus 005 within the vapor deposition chamber 007, it passes through the outlet side seal rolls 003a, 003b, 003c, ... and is delivered into the atmosphere.

The details of each seal roll are illustrated in FIGS. 10 and 11, FIG. 11 being a cross-section view taken along line XI—XI in FIG. 10 as viewed in the direction of arrows.

In FIGS. 10 and 11, reference numerals 1011 and 1012 designate a pair of pinch rolls, numeral 1014 designates seal bars, numeral 1016 designates a casing, numeral 1017 designates an upstream side pressure chamber, numeral 1018 designates a downstream side pressure chamber, numerals 1019a, 1019b and 1019c designate leak gap clearances, more particularly reference numeral 1019a designates a gap clearance between the pinch roll 1011 and the seal bar 1014, numeral 1019b designates a gap clearance between the axial end of the pinch roll 1011 and the casing 1016, and numeral 1019c designates a gap clearance at the portion where the base plate 001 is not present between the pinch rolls 1011 and 1012.

The upstream side pressure chamber 1017 and the downstream side pressure chamber 1018 are partitioned by the pinch rolls 1011 and 1012 and the seal bar 1014, and gas flows from the upstream side to the downstream side through the above-described small leak gap clearances 1019a, 1019b and 1019c.

In addition, a process of forming a thin film by vacuum vapor deposition according to the above-mentioned batch system that is available for vapor-depositing metal or non-metal onto a base plate such as a paper sheet, a plastic film, etc. in the prior art, is such process that a preliminarily coiled base plate is charged within a vacuum envelope, and after the vacuum envelope has been sufficiently evacuated, vapor deposition is effected onto the base plate while it is running. One example of such batch systems in the prior art is illustrated in FIG. 12.

In FIG. 12, a coiled base plate 201 is charged within a vapor deposition chamber 202 as connected to a take-up reel 205 via a deflector roll 203 and a cooling roll 204. After the space within the vapor deposition chamber 202 has reached a predetermined degree of vacuum as evacuated by a vacuum pump unit 2012, the base plate 201 is made to run as pulled by the take-up reel 205, and while it is cooled on the cooling roll 204 so as to suppress temperature rise caused by heating upon vapor deposition, the base plate 201 is vapor-deposited by a vapor deposition apparatus 207. The vapor deposition apparatuses 207 are disposed in multiple at a predetermined interval in the widthwise direction of a vapor deposition material 208 and the base plate 201, each vapor deposition apparatus 207 is constructed of a container 209 for accommodating a vapor deposition material and a heating device 210 for heating the container 209, and it evaporates the vapor deposition material 208 towards the running base plate 201. Since the vapor deposition material 208 evaporated at this time would sputter not only to the just above but also in the oblique directions as spreading, edge masks 2011 are disposed at the positions overlapping the respective edge portions of the base plate 201 as spaced therefrom so that the sputtered material may not deposit onto the portion of the cooling roll 204 itself exceeding the width of the base plate 201. As described above, the vapor deposition work is a batch type of work, in which the number of the vapor deposition material containers 209 and the positions of the edge masks 2011 are preliminarily set by hand in accordance with the width of the base plate for each coil, and then evacuation, heating, running, vapor deposition and exposure to the atmosphere are effected repeatedly.

In the vacuum vapor deposition apparatus in the prior art as illustrated in FIG. 9, it is necessary for allowing the vacuum pumps 004a, 004b, 004c, ... provided to have a small capacity, that the area of the clearance 1019a–1019c is small so that the flow rate of the gas from the upstream side to the downstream side is small.

However, the gap between the rotating pinch roll 1011 or 1012 and the stationary seal bar 1014 or the stationary casing 1016 cannot be made smaller than a certain value in order to prevent contact therebetween, and so reduction of the clearance was limited.

In addition, when gas flows through the gaps, fluttering of the base plate 001 would occur, and there was a distinct possibility of the generation of creases in the base plate 001 or the cutting off of the base plate 001.

In addition, essential reasons for the fact that vapor deposition of the base plate 201 has been effected according to the batch system while continuous vapor deposition has not been practiced with the vapor deposition system shown in FIG. 12, are as follows. Firstly, an evacuation rate for generating a pressure gradient from the atmosphere side to the high vacuum side is enormous, and so, an evacuation pump system capable of operating at such a rate is very large. Therefore, as described above, the system in which a running base plate was pinched by seal rolls so that clearance between the adjacent pressure chambers was reduced, was employed. However, in the case of a thin base plate such as a paper sheet or a plastic film, scratches would be generated on the base plate by pinching, and because this is a fatal defect in view of quality of products, such a system was difficult to be put to practical use. Secondly, when the running base plate passed through the pressure chamber, the base plate would be fluttered by air flowing through the gap between the pressure chambers, thereby causing scratches and breaking.

A third problem resides in that since the vapor deposition material evaporates from the vapor deposition material container and sputters broadly, not only is it deposited onto the base plate, but it is also trapped on the mask. In the case of the batch system, a period of one batch is short, hence the accumulated amount of the sputtered material is little, and a work of removing the accumulated material could be carried out for every batch. But in the case of the continuous system, the vapor deposition material trapped by the mask, the cooling roll and the like would successively increase the accumulated thickness, so that the gap clearance between the cooling roll and the mask would be blocked, and this becomes a cause for damaging the base plate passing through the gap clearance. Furthermore, in the case of the continuous system, it is necessary to be adapted for change of width of the running base plate, hence if the vapor deposition material is trapped on the cooling roll, depending upon the width the base plate would pass over the trapped vapor deposition material, and so, vapor deposition would become difficult. This problem can be said to be a very serious problem in practical use, in view of the fact that according to the batch system in the prior art the yield of the vapor deposition material is 50% or less.

A fourth problem in the prior art resides in that since vapor deposition material is evaporated from a plurality vapor deposition material containers, vapor spreading upwards from one container would form a vapor deposition film as overlapped with vapor evaporated from the adjacent containers, and so, in order to attain a uniform film thickness distribution in the widthwise direction, a skilled technique for controlling the temperature of the respective vapor deposition materials is required. In other words, in order to achieve continuous vapor deposition it is necessary to be continuously adapted for different base plate widths, and monitoring of the temperature of the individual vapor deposition materials and increase or decrease of the number of heated containers have a large time constant and are very disadvantageous in practical use.

Besides the above-described principal problems, in order to realize continuous operations, it is necessary to achieve continuous feeding of a vapor deposition material from the atmosphere into the vacuum envelope as well as continuous feeding and winding of the running base plate, but in practice, any practical proposal for resolving the above-mentioned problems has not been made, and so, the continuous system has not been realized.

Moreover, the vacuum vapor deposition system of the one-batch one-coil type in the prior art as illustrated in FIG. 12 is inefficient and poor in productivity.

Furthermore, it becomes necessary to expose the vacuum chamber to the atmosphere, upon every batch in the case of the batch system shown in FIG. 12, and when the running base plate has been cut or when something unusual has been generated within the vacuum chamber in the case of the continuous system wherein the base plate is made to run continuously. Then, each time a crucible is exposed to the atmosphere at a high-temperature state of 700° C. to 800° C., and sometimes at 1400° C., and therefore, the life of the crucible is shortened due to thermal damage. In addition, in order to prevent damage of the crucible, a work of ladling out a vapor deposition material such as aluminium or the like within the crucible and a work of taking care of the crucible are necessary.

SUMMARY OF THE INVENTION

It is therefore one object of the present invention to provide a continuous vacuum vapor deposition system comprising seal means which reduces a gap clearance cross-section area to minimum to suppress flowing of gas through the gap clearance as much as possible, and thereby the above-described fluttering of a running base plate is not generated.

Another object of the present invention is to provide a continuous vacuum vapor deposition system, in which an enormous evacuation rate is not required for the associated vacuum pump, fluttering of a running base plate in a vacuum vapor deposition apparatus is suppressed to minimum, the vapor deposition process can be readily adapted to any base plate having a different width without trapping a vapor deposition material on an exposed surface within a vapor deposition chamber, and feeding of a vacuum vapor deposition apparatus from the atmosphere into a vapor deposition material container within a vapor deposition chamber can be achieved continuously.

Still another object of the present invention is to provide a continuous vacuum vapor deposition system, in which even if it becomes necessary to expose a vacuum chamber to the atmosphere, the portion of a crucible only can be maintained in vacuum.

In order to achieve the aforementioned objects, according to a number of features of the present invention, continuous vacuum vapor deposition systems as enumerated in the following are provided:

(1) A continuous vacuum vapor deposition system, of the type that a base plate is continuously fed from the atmosphere, made to pass through a reduced-pressure chamber, wrapped around a cooling roll at an upper portion within a vapor deposition chamber, then subjected to vacuum vapor deposition by means of vapor rising from a vapor deposition material container at a lower portion within the vapor deposition chamber, again made to pass through the reduced-pressure chamber, and continuously delivered into the atmosphere; in which in the reduced-pressure chamber, the space between the atmosphere and the vapor deposition chamber is partitioned into a plurality of sub-chambers by means of seal devices, each of the seal devices includes one set of three pinch rolls arrayed in parallel on one plane and a pair of seal bars positioned on the same plane on the respective sides of the pinch roll set with small gap clearances spaced from the pinch rolls, the gap clearances between the center roll and the rolls on the respective sides in the pinch roll set are adapted to make the base plate portions on the inlet side and on the outlet side respectively pass therethrough, in each reduced-pressure sub-chamber are disposed a pair of deflector rolls so that the base plate portions on the inlet side and on the outlet side may be wrapped respectively around the pinch rolls with a wrapping angle of 10 degrees or more, and further, a temperature-adjustable wall surrounding a rising vapor passageway is disposed between the cooling roll and the vapor deposition material container.

(2) A continuous vacuum vapor deposition system as featured in the numbered paragraph (1) above, in which edge masks which are movable in the widthwise direction of the base plate are provided between the cooling roll and an upper portion of the above-mentioned wall.

(3) A continuous vacuum vapor deposition system of the type that a base plate is continuously fed from the atmosphere, made to pass through a reduced-pressure chamber, wrapped around a cooling roll at an upper portion within a vapor deposition chamber, then subjected to vacuum vapor deposition by means of vapor rising from a vapor deposition material container at a lower portion within the vapor deposition chamber, again made to pass through the reduced-pressure chamber, and continuously delivered into the atmosphere; wherein in the reduced-pressure chamber, the space between the atmosphere and the vapor deposition chamber is partitioned into a plurality of sub-chambers by means of seal devices, each of the seal devices includes one set of three pinch rolls arrayed in parallel on one plane and a pair of seal bars positioned on the same one plane on the respective sides of the pinch roll set with small gap clearances spaced from the pinch rolls, the gap clearances between the center roll and the rolls on the respective sides in the pinch roll set are adapted to make the base plate portions on the inlet side and on the outlet side respectively pass therethrough, and there is provided means for feeding a wire-shaped vapor deposition material from the atmosphere through the respective reduced-pressure sub-chambers into the vapor deposition material container within the vapor deposition chamber.

(4) A continuous vacuum vapor deposition system of the type that a base plate is continuously fed from the atmosphere, made to pass through a reduced-pressure chamber, wrapped around a cooling roll at an upper portion within a vapor deposition chamber, then subjected to vacuum vapor deposition by means of vapor rising from a vapor deposition material container at a lower portion within the vacuum vapor deposition chamber, again made to pass through the reduced-pressure chamber, and continuously delivered into the atmosphere; wherein in the reduced-pressure chamber, the space between the atmosphere and the vapor deposition chamber is partitioned into a plurality of subchambers by means of seal devices, each of the seal devices includes one set of three pinch rolls arrayed in parallel on one plane and a pair of seal bars positioned on the same one plane on the respective sides of the pinch roll set with small gap clearances spaced from the pinch rolls, the gap clearances between the center roll and the rolls on the respective sides in the pinch roll set are adapted to make the base plate portions on the inlet side and on the outlet side respectively pass therethrough, and there is provided a vapor deposition material charging device for feeding a granular vapor deposition material from the atmosphere into the vapor deposition material container within the vapor deposition chamber.

(5) A continuous vacuum vapor deposition system of the type that a base plate is continuously fed from the atmosphere, made to pass through a reduced-pressure chamber, wrapped around a cooling roll at an upper portion within a vapor deposition chamber, then subjected to vacuum vapor deposition by means of vapor rising from a vapor deposition material container at a lower portion within the vacuum vapor deposition chamber, again made to pass through the reduced-pressure chamber, and continuously delivered into the atmosphere; wherein in the reduced-pressure chamber, the space between the atmosphere and the vapor deposition chamber is partitioned into a plurality of subchambers by means of seal devices, each of the seal devices includes one set of three pinch rolls arrayed in parallel on one plane and a pair of seal bars positioned on the same one plane on the respective sides of the pinch roll set with small gap clearances spaced from the pinch rolls, the gap clearances between the center roll and the rolls on the respective sides in the pinch roll set are adapted to make the base plate portions on the inlet side and on the outlet side respectively pass therethrough, there is provided a partition wall having an aperture between the cooling roll and the vapor deposition material container, and the aperture is provided with a lid which can sealingly close the aperture and which can be arbitrarily opened and closed.

(6) A continuous vacuum vapor deposition system as featured in the numbered paragraph (1) above, wherein there are provided an uncoiler for continuously feeding the base plate into the reduced-pressure chamber, which is associated with means for cutting and splicing the base plate, and a coiler for continuously taking out the base plate from the reduced-pressure chamber, which is associated with means for cutting and splicing the base plate.

(7) A continuous vacuum vapor deposition system as featured in the numbered paragraph (1) above, wherein the set of three pinch rolls are replaced by a single seal roll, and there are provided a pair of seal bars on the respective sides of the seal roll with such gap clearances spaced from the seal roll that a running base plate can pass therethrough.

The continuous vacuum vapor deposition system according to the present invention as featured in the numbered paragraphs (1) to (7) above can provide the following effects:

1) According to the aspect of the present invention featured in the numbered paragraph (1) above, owing to the facts that a seal device is formed of one set of three pinch rolls arrayed in parallel on one plane, among the pinch roll gap clearances at two locations in the set of three pinch rolls, an inlet side base plate running from the atmosphere towards the vacuum chamber is made to pass through the pinch roll gap clearance at one location, while an outlet side base plate running from the vacuum chamber towards the atmosphere is made to pass through the other pinch roll gap clearance, thereby an inlet side seal device and an outlet side seal device are integrated, that is, among the three pinch rolls in one set, through the gap clearance between the center pinch roll and one pinch roll on either side, a base plate running from the atmosphere side towards the vapor deposition chamber side is made to pass, while a base plate running reversely from the vacuum deposition chamber side towards the atmosphere side is made to pass through the gap clearance between the center pinch roll and the other pinch roll, a plurality of such sets of three pinch rolls are disposed as spaced from each other, and a reduced-pressure chamber is formed between adjacent ones of the similarly constructed sets of three pinch rolls; the number of pinch rolls is reduced, the distance of the pinch roll gap clearances is decreased as compared to the system shown in FIG. 9, hence the capacity of the evacuation system can be greatly reduced, and also a compact construction of the seal device can be realized. In addition, owing to the fact that the set of three pinch rolls forming seal device are arrayed in parallel on one plane, a load applied to the respective seal rolls by the pressure difference between two subchambers partitioned by the seal device acts in the direction perpendicular to the plane. Consequently, due to this load the pinch rolls would deform in parallel to each other in the direction perpendicular to the above-mentioned plane, hence the gap clearances between the pinch rolls and the gap clearances between the pinch rolls and the seal bars on the respective sides would not vary, and the initial values of the gap clearances can be maintained. Therefore, during the period when the base plate is made to pass through the gap clearances under an evacuated condition, the sealing performance would not vary, and the pressure within the chamber or sub-chamber partitioned by the seal device can be maintained stably.

2) According to the aspect of the present invention featured in the numbered paragraph (1) above, owing to the fact that deflector rolls are disposed between the adjacent sets of pinch rolls so that the base plate may be wrapped around the respective pinch rolls with a wrapping angle of 10 degrees or more, fluttering of the base plate caused by an airflow flowing through the gap clearances between the pinch rolls, can be prevented.

3) According to the aspect of the present invention featured in the numbered paragraph (1) above, as a result of the fact that a wall is disposed between the cooling roll and the vapor deposition material container so as to surround the vapor evaporated from the container and the temperature of the wall is controlled in such manner that the inner surface faced to the vapor of the wall may be maintained at a temperature somewhat higher than the melting point of the vapor deposition material, the vapor deposition material other than the amount vapor-deposited onto the base plate is trapped by the wall and flows back into the vapor deposition material container in the form of liquid, so that a yield of the vapor deposition material can be greatly improved, and the problem that the vapor deposition material accumulates and interferes with the base plate such as a film, is also eliminated. In this connection, according to the results of experimental investigations, the yield of the vapor deposition material has been raised up to 90% or more.

4) According to the aspect of the present invention features paragraph (2) above, edge masks are provided within the aforementioned wall so as to be slidable in the widthwise direction of the wall and the base plate, and the relative positioning of the edge masks with respect to the base plate is controlled in accordance with the width of the running base plate. That is, by continuously controlling the edge masks to be positioned such that the edge masks overlap, by a minute amount, the opposite widthwise edge portions of the base plate, the vapor rising within the wall can be prevented from sputtering to locations exceeding the width of the base plate and being deposited onto the cooling roll. Thus, base plates having different widths can be continuously and stably subjected to vapor deposition.

5) According to the aspects of the present invention features in paragraphs (3) and (4) above, the means for feeding vapor deposition material is adapted to feed the vapor deposition material from the outside of a vacuum vapor deposition apparatus into a vapor deposition chamber. The vapor deposition material to be fed is initially disposed outside of the apparatus. Moreover, a drive section for feeding the vapor deposition material into the vapor deposition chamber is also disposed outside of the apparatus, and components of the feeding means to be disposed inside of the apparatus having a simple construction and being hardly damaged such as, for example, guide means for a vapor deposition metal (guide rolls, guide plates, etc.). Therefore, the vacuum vapor deposition apparatus would not become large-sized, and even if the vapor deposition material feed means should stop, the feed means only can be easily repaired without stopping the entire apparatus.

6) According to the aspect of the present invention featured in the numbered paragraph (3) above, since the vapor deposition material is wire-shaped, holes of a few millimeters in diameter are drilled in the respective seal bars in the reduced-pressure chamber, and the wire-shaped vapor deposition material placed on the outside is made to pass successively through these holes and thus can be fed to the vapor deposition chamber. In this feed means, if the gap clearance between the edge of the hole drilled in each seal bar and the wire-shaped vapor deposition material passing through this hole is made extremely small (of the order of 1/100 or less) as compared to the cross-section area of the gap clearances at the periphery of the above-described seal rolls, then a pressure rise caused by the gap clearance around the wire-shaped material becomes a negligible order, and so, the vapor deposition metal can be continuously fed while continuing the vacuum vapor deposition operation.

7) According to the aspect of the present invention featured in the numbered paragraph (5) above, during a vapor deposition operation, a vapor deposition material evaporated from a crucible containing the vapor deposition material is made to pass through the aperture in the partition wall and deposited onto a running base plate wrapped around the cooling roll (vapor deposition roll). In the case where necessity for exposing to the atmosphere has occurred such as the case where the running base plate has been cut, the aperture is sealingly closed, then only the portion of the vapor deposition chamber where the crucible is accommodated is evacuated, and the portion where the vapor deposition roll is present is exposed to the atmosphere.

8) According to the aspect of the present invention featured in the numbered paragraph (6) above, continuous feeding of a base plate to a vacuum vapor deposition apparatus is made possible by rotatably mounting a pair of reels respectively on the inlet side and on the outlet side of the seal device, and disposing a coiler and an uncoiler provided with a press roll for sticking a base plate being paid out from or being wound around a pair of reels to another reel and a cutter for cutting a base plate being paid out from or being wound around the original reel after sticking.

9) According to the aspect of the present invention features in paragraph (7) above, by providing a vacuum deposition system in which a base plate can pass through the gaps between the pinch roll and the seal bars on the respective sides of the pinch roll, the number of rolls and the total clearance can be minimized.

The above-mentioned and other objects, features and advantages of the present invention will become more apparent by referring to the following description of preferred embodiments of the invention taken in conjunction with the accompanying drawings.

DESCRIPTION OF THE PREFERRED EMBODIMENTS

Now one preferred embodiment of the present invention will be described with reference to FIGS. 1 to 4.

Figure 1:
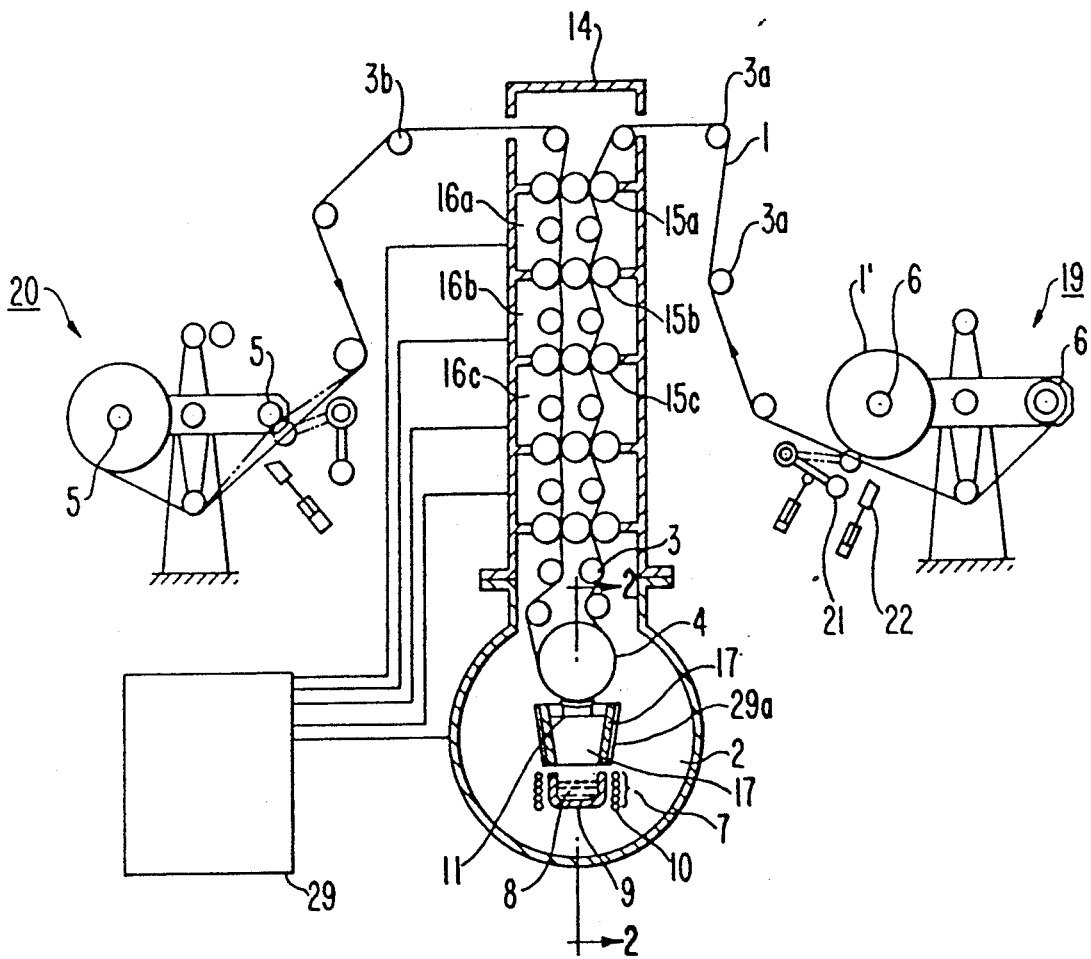
FIG. 1 is a schematic front view, partly in cross section, of one preferred embodiment of the present invention.
Figure 2:
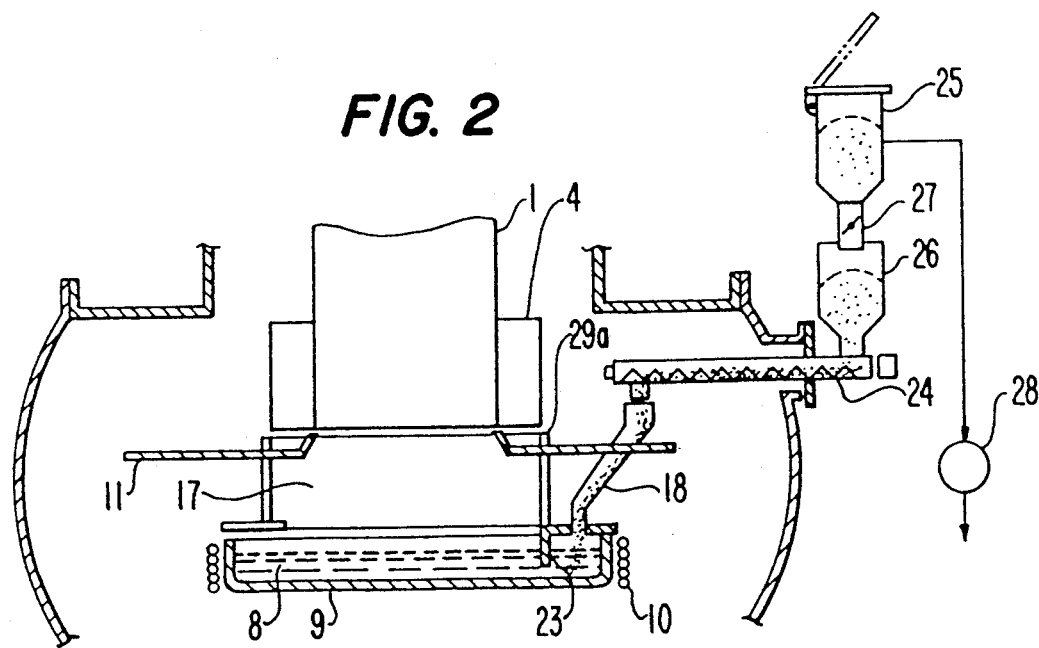
FIG. 2 is an enlarged partial cross-sectional view taken along line 2—2 in FIG. 1 as viewed in the direction of arrows.

In FIGS. 1 and 2, reference numerals 1 and 1' designate running base plate 5, numeral 2 designates a vapor deposition chamber, numeral 3 designates deflector rolls, numeral 4 designates a cooling roll, numeral 5 designates a take-up reel, numeral 6 designates a pay-out reel, numeral 7 designates a vapor deposition apparatus, numeral 8 designates a vapor deposition material, numeral 9 designates a vapor deposition material container, numeral 10 designates a heater, numeral 11 designates edge masks, numeral 14 designates a reduced-pressure chamber, numerals 15a, 15b and 15c, respectively, designate respective sets of three pinch rolls, numerals 16a, 16b and 16c, respectively designate reduced-pressure sub-chambers, numeral 17 designates a wall, numeral 18 designates a vapor deposition material charging port, numeral 19 designates an uncoiler, numeral 20 designates a coiler, numeral 21 designates a press roll, numeral 22 designates a cutter, numeral 23 designates a dam, numeral 24 designates a constant rate feeder, numeral 25 designates a receiving hopper, numeral 26 designates a feeding hopper, numeral 27 designates a valve, numeral 28 designates a vacuum pump, and numeral 29 designates an evacuation pump unit.

In FIG. 1, a base plate 1 is mounted on a reel 6 of a pair of reels in the uncoiler 19, and fed to the reduced-pressure chamber 14 via deflector rolls 3a and the like. This reduced-pressure chamber 14 includes reduced-pressure sub-chambers 16a, 16b, 16c, ... partitioned by a plurality of sets of three pinch rolls arrayed in parallel with one plane passing through the axes of rotation thereof, which pinch roll sets are spaced from each other by predetermined intervals. An evacuation pump unit 29 connected to the respective reduced-pressure chambers 16a, 16b and 16c generates a pressure gradient from the atmosphere side to the vapor deposition chamber 2 so as to maintain a predetermined vacuum within vacuum deposition chamber 2. The base plate 1 successively passes through the roll gap clearances between two pinch rolls on one side of each of the sets of three pinch rolls 15a, 15b and 15c. After it has been subjected to vapor-deposition on the cooling roll 4 by means of the vapor deposition apparatus 7, it runs reversely through the gap clearances between two pinch rolls on the opposite side of each of the sets of three pinch rolls 15a, 15b and 15c. Then it is delivered from the reduced-pressure chamber 14. The base plate 1 delivered into the atmosphere is taken up by a reel 5 of a pair of reels in a coiler 20 via deflector rolls 3b and the like. In order to continuously pay out and take up a base plate 1, another new base plate 1' is mounted on the other reel 6 in the uncoiler 19. After the base plate 1' has been accelerated and synchronized with the speed of the running base plate 1 by means of a drive unit not shown, it is pressed against the running base plate 1 by actuation of the press roll 21, and the respective base plates 1 and 1' are stuck with each other by means of a double-faced adhesive tape or the like mounted on the new base plate 1'. Furthermore, simultaneously with the sticking, the cutter 22 would cut the old base plate 1, and only the new base plate 1' is made to pass through the reduced-pressure chamber 14. With regard to the take-up operation also, likewise on the other reel 5 in the coiler 20 is stuck a double-faced adhesive tape or the like, and after the reel 5 has been synchronized with the running base plate 1, the base plate 1 is stuck with the reel 5 by means of the press roll 21, and the base plate 1 begins to be taken up by the new reel 5 by cutting the base plate 1 with the cutter 22 simultaneously with the sticking.

On the other hand, vapor deposition is carried out in such manner that an evaporated vapor deposition material 8 passes through a passageway surrounded by the wall 17 disposed above the vapor deposition material container 9, further the expansion of the evaporated material in the widthwise direction of the base plate is limited by the edge masks 11 disposed at the above, and it reaches the base plate 1, as shown in FIG. 2. At this time, while the evaporated vapor deposition material 8 is also trapped by the edge masks 11 and the wall 17, it is returned into the vapor deposition material container 9 in the form of liquid because the inner surfaces of the respective members are held at a temperature higher than a melting point of the vapor deposition material due to radiation heat from the vapor deposition material container 9. In addition, on the outer circumference of the wall 17 shown in FIGS. 1 and 2 is provided a cooling device 29a for externally feeding a coolant such as water or the like to regulate the temperature of the wall 17 so as to be maintained at a predetermined temperature. This predetermined temperature is a temperature that is a little higher than the melting point of the vapor deposition material 8, and in the case where the vapor deposition material 8 is aluminium, the wall 17 is regulated to be maintained at a temperature of about 900° C. to 1000° C.

In the illustrated embodiment, the vapor deposition material 8 within the vapor deposition material container 9 is aluminium, and this container 9 is heated at about 1400° C. The temperature regulation for the wall 17 by means of the above-described cooling device 29a is effected for the purpose of preventing excessive temperature rise caused by radiation heat from the side of the vapor deposition material container 9, and thus for the purpose of preventing adverse thermal effect upon the running base plate 1 consisting of a plastic film or the like of the excessive temperature rise, that is, for the purpose of preventing generation of thermal elongation of the base plate 1 (plastic film) and creases on the base plate 1.

The above-described wall 17 is provided for the purpose of guiding the rising vapor evaporated from the vapor deposition material 8 to the base plate 1 wrapped around the cooling roll 4 without sputtering the rising vapor to the environment. The edge masks 11 shown in FIG. 2 are disposed as spaced at a certain interval in the widthwise direction of the base plate 1, and they are movable in the widthwise direction of the base plate 1 so that the vapor deposition apparatus can be adapted to change of the width of the base plate 1.

The amount of the vapor deposition material 8 consumed by evaporation is fed by the vapor deposition material charging device shown in FIG. 2, which consists of the vapor deposition material receiving hopper 25, the valve 27, the feed hopper 26 and the constant rate feeder 24 such as a screw feeder or the like. More particularly, at first a predetermined amount of the vapor deposition material 8 is thrown into the receiving hopper 25, then after the interior of the receiving hopper 25 has been maintained at a predetermined degree of vacuum, the valve 27 is opened, and the vapor deposition material 8 within the receiving hopper 25 is transferred to the feed hopper 26. After the transfer, the valve 27 is closed, the vacuum pump 28 is stopped, and at the time point when the vapor deposition material 8 within the feed hopper 26 has been reduced to a lower limit amount, the above-described operations are repeated again. During this period, since the constant rate feeder 24 is continuously conveying the vapor deposition material 8, always a fixed amount of vapor deposition material 8 is surely maintained within the vapor deposition material container 9.

It is to be noted that as a newly thrown vapor deposition material contains an impurity such as oxides or the like though very little, the impurity would be accumulated within the container resulting in the problem that an evaporation rate is lowered, and therefore, provision is made such that the dam 23 is provided at one end portion of the container 9, and by throwing in the vapor deposition material 8 through the vapor deposition material throw-in port 18 provided on the outside of the dam 23, the impurity may be accumulated on the outside of the dam 23, while a high-impurity vapor deposition material may pass underside of the dam 23.

Figure 3A:
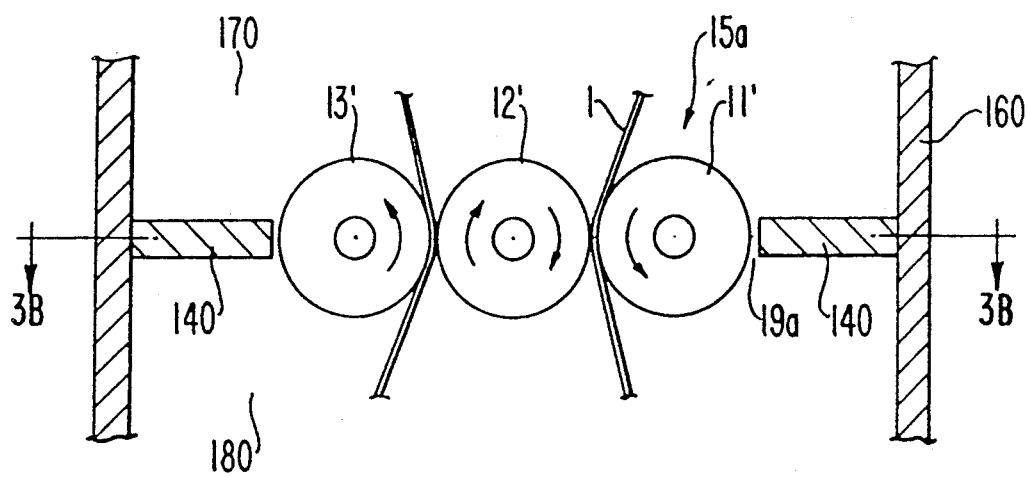
FIG. 3(A) is an enlarged front view of a pinch roll portion in the same preferred embodiment.
Figure 3B:
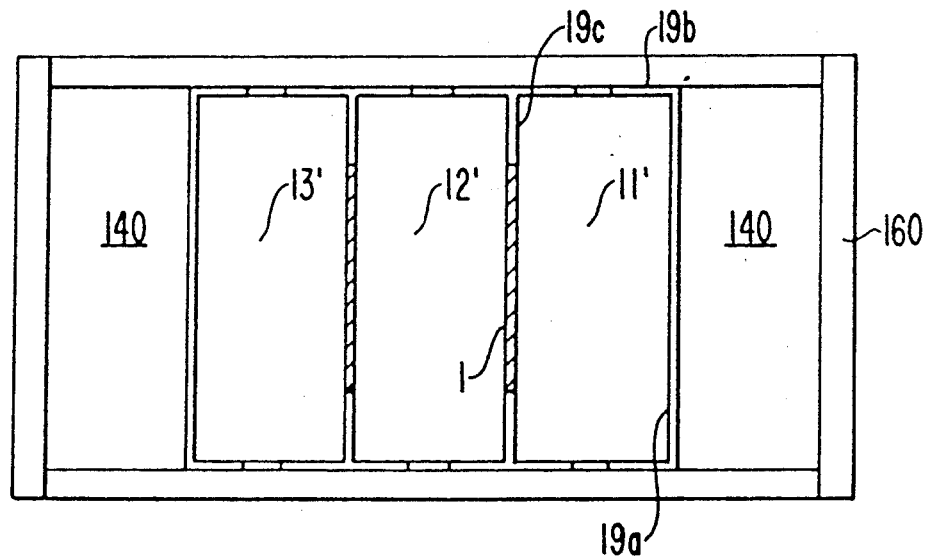
FIG. 3(B) is a plan view of the same.

Each of the seal rolls 15a, 15b, 15c, ... shown in FIG. 1 is formed of one set of three pinch rolls 11', 12' and 13' as shown in FIGS. 3(A) and 3(B), and the pinch rolls 11' and 13' are rotationally driven by a drive unit not shown. If the seal roll consisting of one set of three pinch rolls in the above-described manner is employed, since the total number of gaps 19a-19c are fewer than in the known structure in the prior art, the cross-sectional area of clearance can be decreased from a structural point of view, and so, a seal performance is improved.

Furthermore, as shown in FIGS. 3(A) and 3(B), the three pinch rolls 11', 12' and 13' are arrayed in parallel with a plane passing through the axes of rotation thereof between seal bars 140 on the respective sides. The seal bars 140 on the respective sides are spaced from the pinch rolls 11' and 13' via small gaps 19a and are fixedly secured to a casing 160. Therefore, during evacuation by the evacuation pump unit 29 in FIG. 1, a pressure difference would arise between the upstream and downstream sides of the seal device, and hence, a load applied to the pinch rolls due to the pressure difference would act in the direction perpendicular to the aforementioned plane. Accordingly, bending deformation of the pinch rolls caused by the load would arise while being held parallel to the plane passing through the seal bars and while maintaining the initial gap clearances 19a, so that a seal performance would not vary during the pass of the base plate in vacuum and a predetermined pressure can be stably maintained within the respective reduced-pressure sub-chambers. Moreover, since the base plate always passes through the gap between the pinch rolls, and since the base plate is guided by the pinch rolls rotating at substantially the same peripheral speed as the running speed of the base plate, even when a double-layer portion corresponding to a spliced portion of base plate passes through the seal device, or even when the base plate passes through the seal device while momentarily floating up from the pinch roll due to tension variations, generation of scratches on the base plate or breaking of the base plate would not occur.

In addition, as shown in FIG. 1, a wrapping angle of the base plate 1 around the pinch roll is insured to be 10° or larger by means of a pair of deflector rolls 3 provided between the adjacent pinch roll pairs (that is, within the respective reduced-pressure sub-chambers 6a, 6b, 6c, ...), and so, even if a leak gas should be generated, fluttering of the running base plate 1 caused by the leak gas would be extremely little.

Figure 4A:
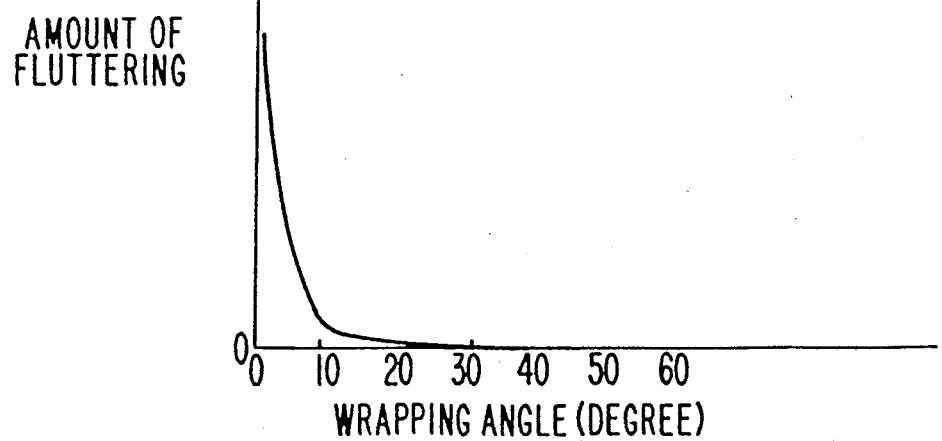
FIG. 4(A) is a diagram showing a relation between a wrapping angle of a base plate around a pinch roll and the amount of fluttering of the base plate.

According to experiments conducted by the inventors of this invention, as shown in FIG. 4(A), this wrapping angle is appropriate when it is 10° or larger, and if the base plate is wrapped around the pinch roll with a wrapping angle of 10° or larger, fluttering of the base plate would become no issue.

Figure 4B:
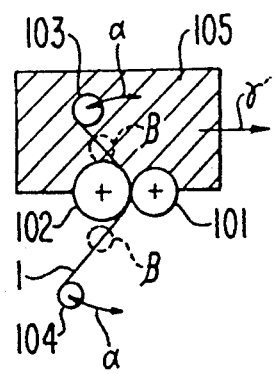
FIG. 4(B) is a schematic view of a device employed to derive the relation shown in FIG. 4(A)

It is to be noted that the data shown in FIG. 4(A) were obtained as a result of experiments conducted in essence as shown in FIG. 4(B). More particularly, in FIG. 4(B) between a seal roll 101 of 80 mm in diameter and a seal roll 102 of 90 mm in diameter, is made to run each of two films (running base plates) 1 having a width of 400 mm and thicknesses of 12 $\mu$m and 20 $\mu$m, respectively. Then, a guide roll 103 within a vacuum chamber 105 and a guide roll 104 within the atmosphere were moved along arcs indicated by double-headed arrows $\alpha$ to vary a wrapping angle of the film 1 around the seal roll 102, and a fluttering state (an amplitude of fluttering) of the film 1 at the portions encircled by dash lines $\beta$ was visually evaluated. At this time, the interior of the vacuum chamber 105 was evacuated in the direction of an arrow γ by means of a vacuum pump and the pressure in the vacuum chamber 105 was adjusted to 360 Torr so that the pressures at the before and behind the pinch rolls 101 and 102 may become the atmospheric pressure and 360 Torr, respectively, which are the most severe conditions for fluttering of the film, where a flow rate of the gas passing between the pinch rolls 101 and 102 becomes the maximum.

According to the illustrated embodiment of the present invention, the following advantages were obtained:

(1) By constructing a vapor deposition material container as an integral container extending in the widthwise direction of the base plate, an evaporation surface becomes continuous in the widthwise direction, distribution of a thickness of a vapor deposition film deposited on the base plate becomes uniform, furthermore the distribution state would not vary even if the edge masks are displaced at the above of the container in accordance with a width of a base plate, and therefore, continuous vapor deposition can be effected stably.

(2) By providing a dam at one end portion of the vapor deposition material container and disposing a vapor deposition material throw-in port on the outside of the dam, in other words, by partitioning the upper layer of the vapor deposition material in a molten state as heated within the container by means of a dam so that the molten vapor deposition material can communicate through a bottom portion and continuously feeding a new vapor deposition material through a vapor deposition material throw-in port disposed above the partitioned outside portion of the molten vapor deposition material, the problem that oxides or the like contained in the vapor deposition material entering the partitioned inside portion and accumulating on the surface of the molten vapor deposition material, resulting in deterioration of an evaporation performance, can be prevented.

(3) Vacuum vapor deposition material is once thrown into the receiving hopper. And, after the interior of the receiving hopper has been maintained at a predetermined degree of vacuum by means of a separately provided vacuum pump, the material is stored in a feed hopper at the lower level by opening a valve below the receiving hopper. The material is continuously fed from the feed hopper and continuously thrown into the throw-in port above the vapor deposition material container at a feed rate regulated to match evaporation rate by means of a feeder such as a screw feeder. At the time when the vapor deposition material within the feed hopper has reached its lower limit value, the valve below the receiving hopper is closed. Then, it is possible to throw in vapor deposition material while the feed hopper is sealed from the atmosphere.

Figure 5:
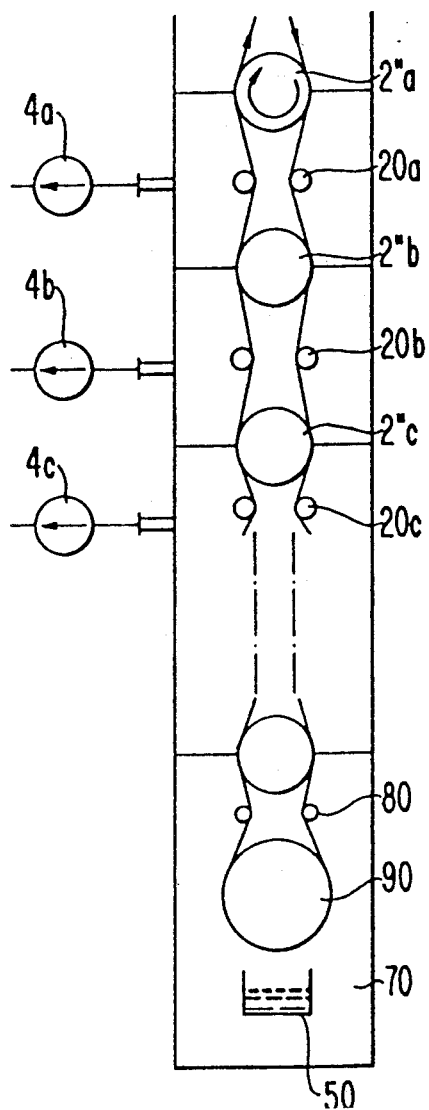
FIG. 5 is a front view of a modified embodiment of the present invention, in which a single pinch roll is employed in a seal device.
Figure 6A:
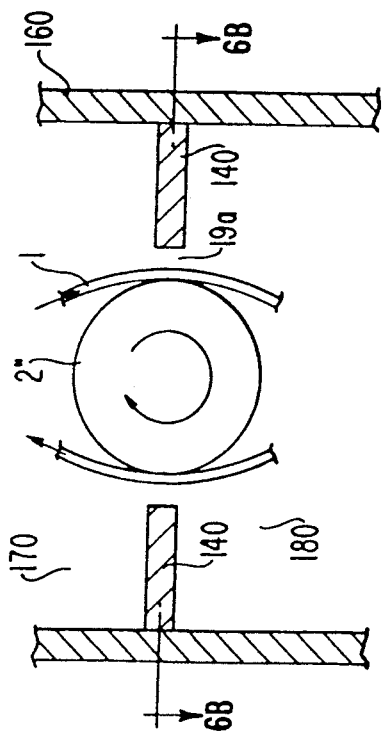
FIG. 6(A) is an enlarged front view of a pinch roll portion in the modified embodiment.
Figure 6B:
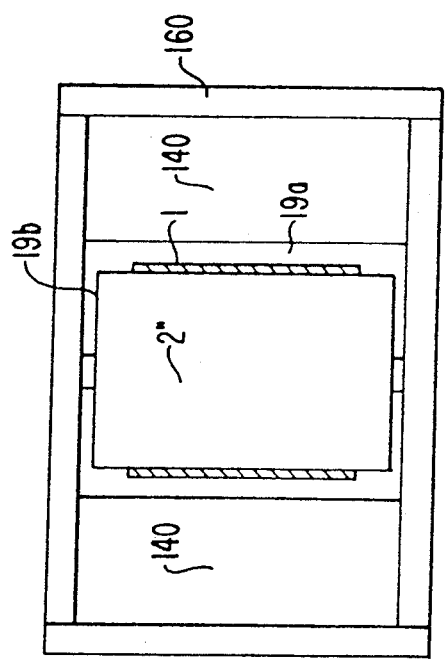
FIG. 6(B) is a cross-section view taken along line 6B—6B in FIG. 6(A) as viewed in the direction of arrows.

FIGS. 5, 6(a) and 6(B) show another preferred embodiment of the present invention.

FIG. 5 is a schematic view of the entire construction, FIG. 6(A) shows a part of the construction in FIG. 5 in more detail, and FIG. 6(B) is a cross-section view taken along line B—B in FIG. 6(A) as viewed in the direction of arrows.

In the embodiment shown in FIG. 5, each of the seal rolls 2"a, 2"b, 2"c, ... is formed of a single pinch roll, which serves commonly as an inlet side seal roll and an outlet side seal roll. These seal rolls 2"a, 2"b, 2"c, ... are respectively driven in rotation by means of drive units not shown.

These seal rolls 2" form respective seal devices jointly with seal bars 140 disposed on the respective sides of the single seal roll 2", as shown in FIGS. 6(A) and 6(B).

With such seal devices, the total number of leak gap clearances 19a and 19b is decreased as compared to the structure in the prior art, hence in view of a structural point of view the sum of the leak gap clearance cross-section areas can be reduced, and a seal performance can be improved.

In addition, as shown in FIG. 5, a wrapping angle of a running base plate 1 around the seal rolls 2"a, 2"b, 2"c, ... is surely maintained larger than a predetermined angle by means of guide (deflector) rolls 20a, 20b, 20c, ... disposed between the adjacent seal rolls, and so, even if a leak gas should be generated, fluttering of the running base plate 1 caused by the leak gas is extremely little. Accordingly, there is no fear that the running base plate 1 may come into contact with the seal bars 140 and may be cut thereby.

According to experiments conducted by the inventors of this invention, as shown in FIG. 4(A), this wrapping angle is appropriate if it is 10 degrees or more, and if the base plate is wrapped around the seal roll with a wrapping angle of 10 degrees or more, the problem of fluttering of the running base plate can be eliminated.

In still another preferred embodiment shown in FIG. 7, a continuous vacuum vapor deposition system is constructed and operated in the following manner. A plastic film (base plate) 1 paid out of a device for paying out a coiled film (not shown) passes through a gap between pinch rolls 02 and 02' at an inlet of a continuous vacuum seal apparatus A consisting of reduced-pressure sub-chambers a-e, then enters into a first stage reduced-pressure sub-chamber a, subsequently passes through a gap between pinch rolls 03 and 03' at an inlet of a second-stage sub-chamber b, enters the second-stage reduced-pressure sub-chamber b, then successively passes through the gaps between pinch rolls 04 and 04', between pinch rolls 05 and 05', between pinch rolls 06 and 06', and between pinch rolls 07 and 07' to thus pass through the reduced-pressure sub-chambers c-e, eventually it is led to a vapor deposition chamber f, after vapor of aluminium 010 molten in a crucible 09 has been deposited onto the base plate under a cooling roll 08, the base plate 1 is again led into the above-described continuous vacuum seal apparatus A, then inversely to the above-mentioned inlet side route, it passes successively through the gaps between pinch rolls 07' and 07", between pinch rolls 06' and 06", between pinch rolls 05' and 05", between pinch rolls 04' and 04", between pinch rolls 03' and 03" and between pinch rolls 02' and 02" to thus pass through the fifth to first stages of reduced-pressure sub-chambers e-a, then it is delivered into the atmosphere, and the base plate is taken up by a take-up device not shown.

It is to be noted that once vapor deposition for one coil of film has been finished, the coiled film is successively exchanged by means of continuous exchanging devices not shown provided in the pay-out section and in the take-up section, respectively, in the continuous vapor deposition system, hence they are successively vapor-deposited without interruption, and the system can be operated continuously over 300 hours or more.

Here, it is to be noted that the above-described continuous vacuum seal apparatus A is composed of a plurality of seal bars 02''', 03''', 04''', 05''', 06''' and 07''', a plurality of reduced-pressure sub-chambers a, b, c, d and e, a vapor deposition chamber f, and vacuum pumps I, II, III, IV, V and VI for evacuating the respective reduced-pressure sub-chambers a–e and the vapor deposition chamber f, respectively, and the apparatus A is operated in such manner that air flowing in through the gap clearances between the pinch rolls themselves and between the pinch rolls and the seal bars may be evacuated continuously, and the pressures within the respective subchambers a–f may be respectively held at vacuum pressures successively lowered up to high vacuum from the atmosphere towards the vapor-deposition chamber as shown in the example of practical data enumerated below.

First stage vacuum sub-chamber a: 400 Torr
Second stage vacuum sub-chamber b: 150 Torr
Third stage vacuum sub-chamber c: 50 Torr
Fourth stage vacuum sub-chamber d: 5 Torr
Fifth stage vacuum sub-chamber e: $1 \times 10^{-2}$ Torr
Vapor deposition chamber f: $1 \times 10^{-4}$ Torr The above-described pinch rolls 02, 02', 02", 03, 03', 03", ..., 07, 07' and 07" form six sets each consisting of three pinch rolls, and each of the respective sets of three pinch rolls 02, 02' and 02"; 03, 03' and 03"; ...; 07, 07' and 07" are arrayed in parallel on one plane perpendicular to the plane of the plastic film 1 passing through the gap clearances between adjacent pinch rolls.

In addition, under the above-mentioned cooling roll 08 is disposed a crucible 09 for melting aluminium 010, and this crucible 09 is heated by heater means such as, for example, a high frequency induction heating apparatus (not shown).

By the way, normally a consumption rate of aluminium is about 1 kg/h, and an aluminium storage amount of the crucible 09 is of the order of about 10 kg. Accordingly, once aluminium has been charged in the crucible 09, the system is operable for about 8–9 hours without supplementing aluminium, but if the operation prolongs for a longer period than the above-mentioned period, it is necessary to supplement aluminium by aluminium feed means according to the present invention, which is constructed, for instance, in the following manner.

More particularly, the aluminium feed means is constructed in such manner that holes $x_1$, $x_2$, $x_3$, $x_4$, $x_5$ and $x_6$ for making an aluminium wire 011 pass therethrough are formed in the seal bars 02''', 03''', 04''', 05''', 06''' and 07''', respectively, which partition the above-described respective reduced-pressure sub-chambers a–e, the aluminium wire 011 is made to pass through these holes in the same direction as the direction of passing of the plastic film 1, and the aluminium wire can be fed into the crucible 09 by means of a continuous feeder 011' for the aluminium wire 011 provided in the atmosphere, a guide roll 012, and a feed roll 013 driven by a drive unit not shown. In this connection, the gap clearances between the aluminium wire 011 and the holes $x_1$–$x_6$ are preset so as to be a few millimeters or less to reduce a flow rate of air leaking through these gap clearances to a sufficiently negligible mount. As shown in FIG. 7, within the vapor deposition chamber f are also disposed guide rolls 012', guide plates 012" and guide rolls 013 for the aluminium wire 011.

The above-described aluminium feed means employed in the illustrated embodiment is intermittently operated, for instance, about every 8–9 hours as described above, and during the operation stop period, the tip end of the aluminium wire 011 is positioned above and in the proximity of the surface of the molten aluminium 010, but the other portion (the portion other than the tip end portion) is held to be positioned between the guide plates 012", between the guide rolls 012' and within the holes $x_6$–$x_1$. Even during this operation stop period, the gap clearances between the aluminium wire 011 and the holes $x_1$–$x_6$ are sufficiently small, hence the flow rate of air leaking through the gap clearances can be disregarded, and vapor deposition can be favorably continued.

Figure 8:
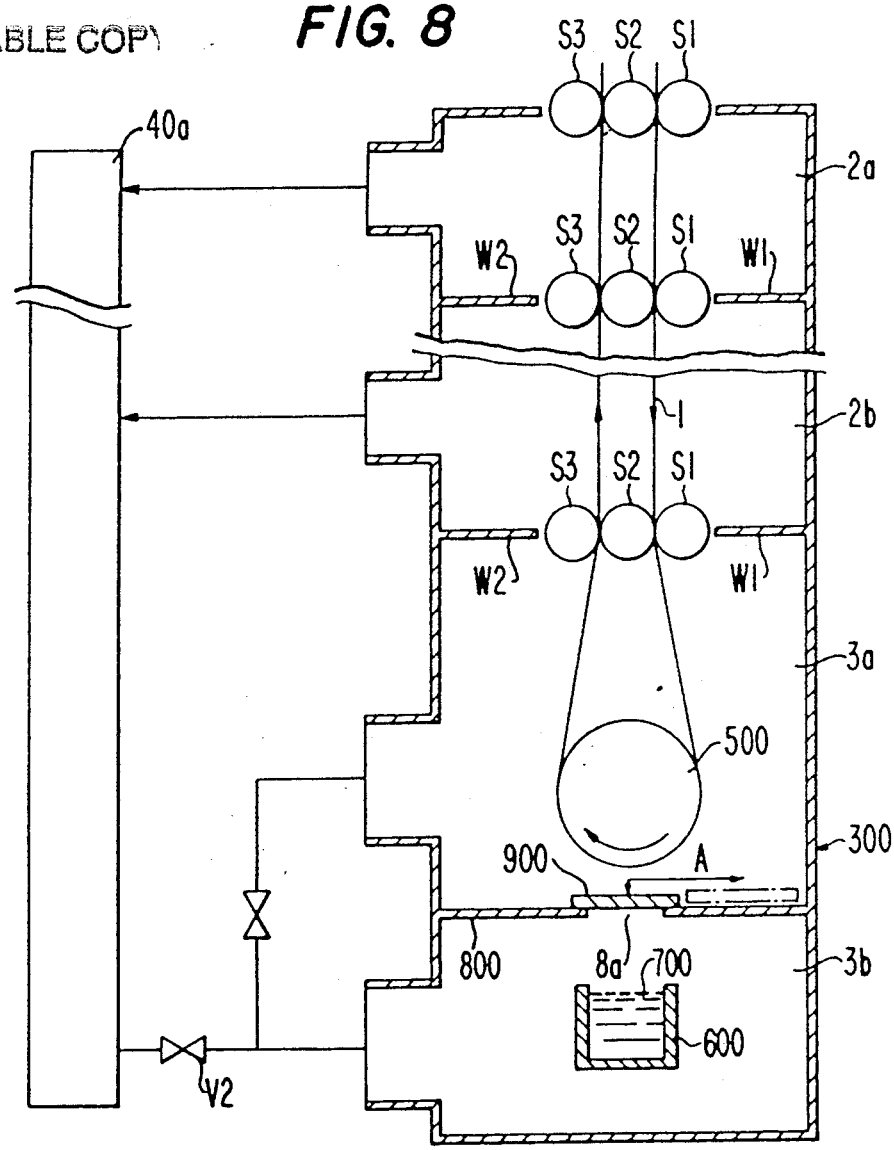
Figure 9:
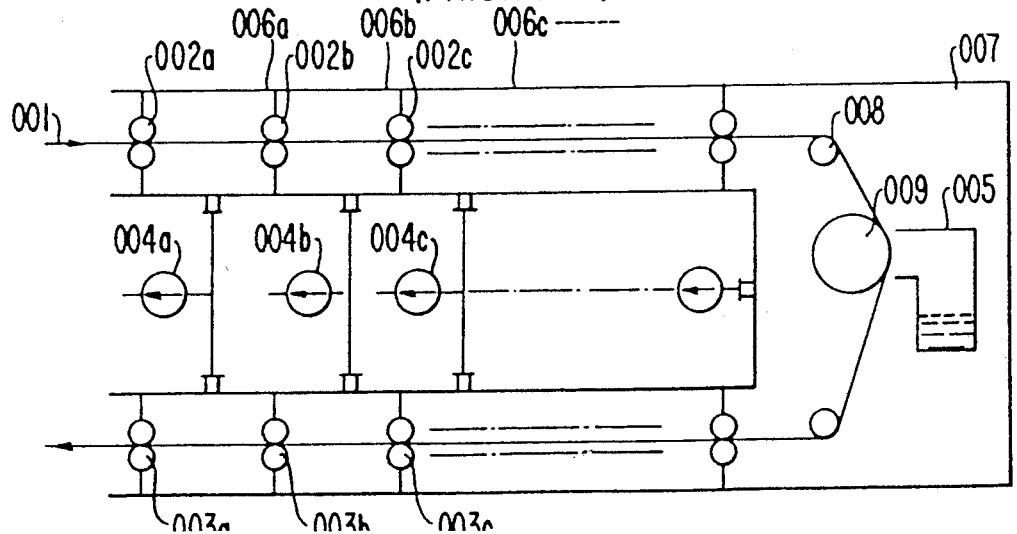
FIG. 9 is a front view showing one example of a continuous vapor deposition system in the prior art.
Figure 10:
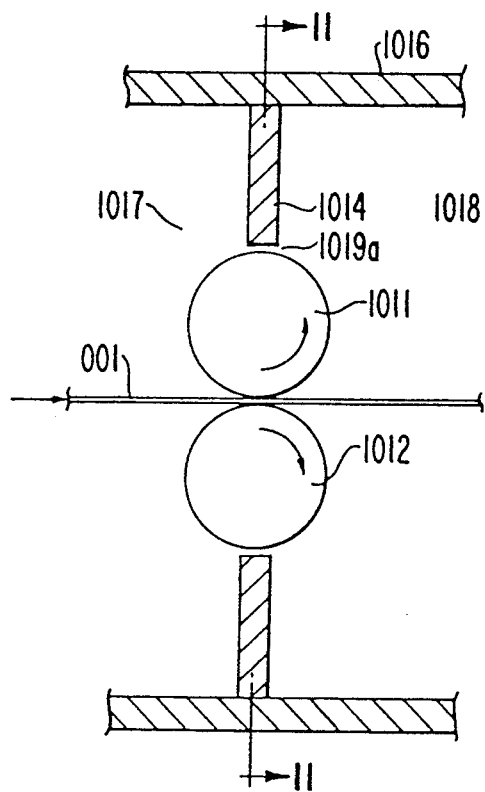
FIG. 10 is an enlarged partial cross-section view of the same continuous vapor deposition system.
Figure 11:
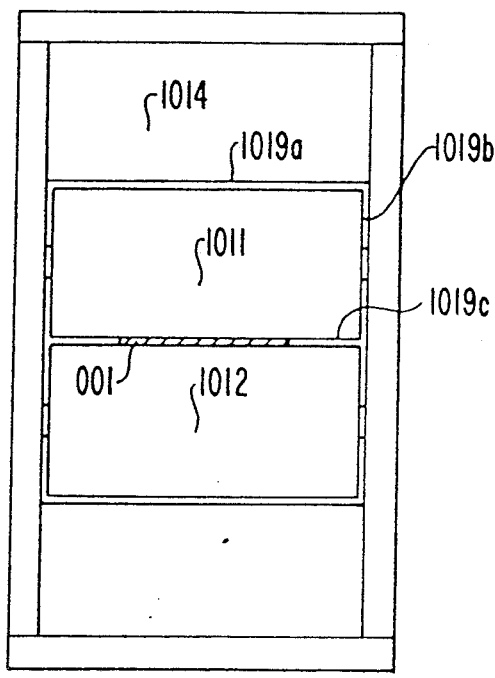
FIG. 11 is an enlarged side view of the same system taken along line 11—11 in FIG. 10 as viewed in the direction of arrows.
Figure 12:
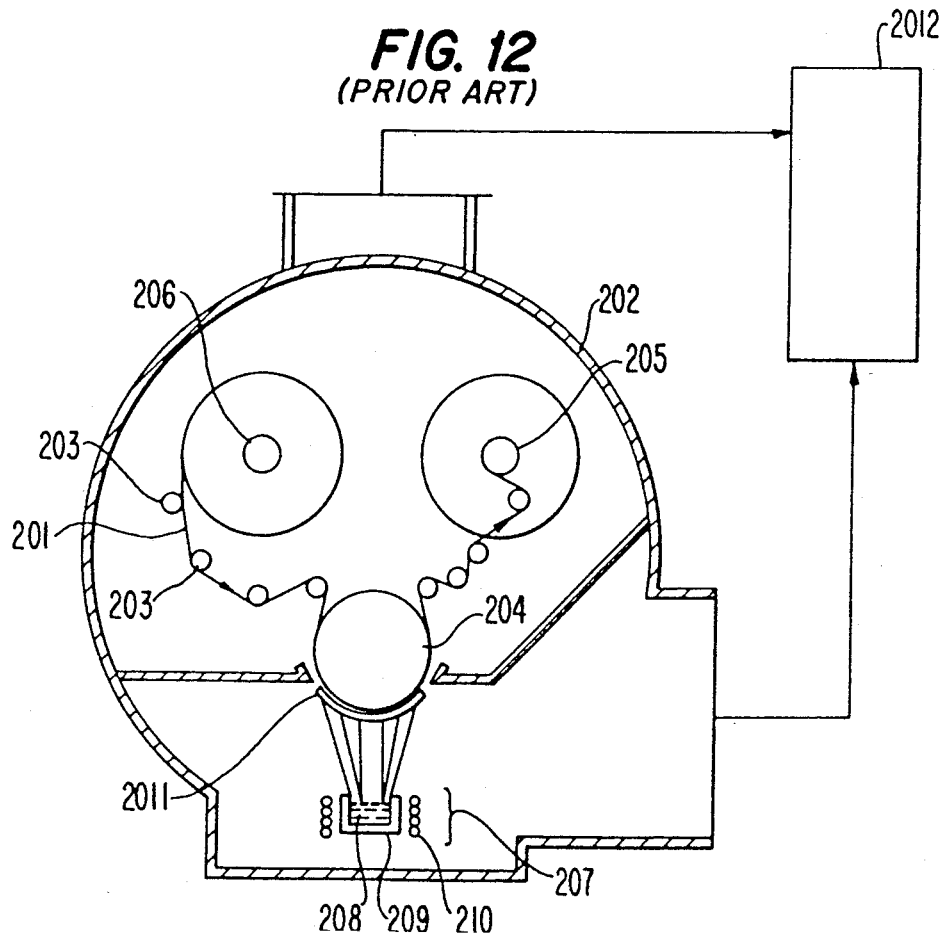
FIG. 12 is a front view showing another example of a vapor deposition system of batch type in the prior art.

FIG. 8 is a longitudinal cross-section side view showing yet another preferred embodiment of the present invention, in which aluminium is employed as a vapor deposition material, and it is vapor-deposited on a base plate consisting of a plastic film.

A plastic film wound in a coil shape is paid out from a pay-out device (not shown) disposed in the atmosphere, passes through a gap clearance between pinch rolls $S_1$ and $S_2$ in a first stage, and enters in a reduced-pressure sub-chamber $2a$ surrounded by one set of three pinch rolls $S_1$, $S_2$ and $S_3$ arrayed in parallel on one plane and seal bars $W_1$ and $W_2$. Reduced-pressure sub-chambers having an almost similar structure are disposed in series in a plurality of stages (6–7 stages), and the plastic film 1 successively passes these reduced-pressure sub-chambers, and eventually enters from the last reduced-pressure sub-chamber to a vapor deposition chamber 300. The above-mentioned reduced-pressure sub-chambers $2a$, ..., $2b$ and the vapor deposition chamber 300 are respectively evacuated by a vacuum evacuation unit 400, and the pressures in these sub-chambers and chamber are successively reduced in steps from the atmospheric pressure to a high vacuum pressure.

In the vapor deposition chamber 300, the plastic film 1 is wrapped around a cooling roll 500. After aluminium vaporized from the inside of a crucible 600 has been deposited thereto, it passes through a gap clearance between the pinch rolls $S_2$ and $S_3$, then passes through the reduced-pressure sub-chambers $2b$, ..., $2a$, and is delivered into the atmosphere through the gap clearance between the pinch rolls $S_2$ and $S_3$ at the top of the reduced-pressure sub-chamber $2a$, and the plastic film 1 is taken up by a take-up device not shown.

The vapor deposition chamber 300 is partitioned by a partition wall 800 into an upper vapor deposition sub-chamber $3a$ containing the cooling roll 500 and a lower vapor deposition sub-chamber $3b$ containing a crucible 600 made of graphite and having heating means such as a high frequency induction heater (not shown) or the like. In the partition wall 800 is provided an aperture $8a$ for allowing vapor of aluminium 700 within the crucible 600 to pass therethrough, and at the aperture $8a$ is provided a lid 900, which can be moved in the horizontal direction and in the vertical direction (indicated by arrows A). Between the bottom surface of the lid 800 and the upper surface of the partition wall 800 is provided vacuum seal means (for instance, an O-ring and metal surfaces).

During a vapor deposition work, the lid 900 is positioned sideways of the aperture $8a$, and vapor of aluminium 700 within the crucible 600 is deposited onto the plastic film 1 which is running as wrapped around the cooling roll 500. During this period, a valve $V_1$ in a vacuum piping connected to the upper vapor deposition sub-chamber $3a$ and a valve $V_2$ in a vacuum piping connected to the lower vapor deposition sub-chamber $3b$ are both held in opened states, and thereby the entire vapor deposition chamber 300 is held at a pressure of the order of $1 \times 10^{-4}$ Torr.

In the event that necessity for opening the vacuum vapor deposition system has occurred (for instance, in the case of breaking of the film), after the inner pressure of the lower vapor deposition sub-chamber 3b was raised up to a pressure at which aluminium 700 cannot evaporate (for instance, $1 \times 10^{-2}$ Torr) by closing the valve $V_1$ for the upper vapor deposition 3a, the lid 900 is moved to the aperture 8a by moving means not shown to effect vacuum seal, and the aperture 8a is sealingly closed. In this way, under the condition that only the lower vapor deposition chamber 3b is held at the pressure at which aluminium 700 cannot evaporate, the reduced-pressure sub-chambers 2a, ..., 2b and the upper vapor deposition sub-chamber 3a are opened, and the necessary work (for instance, splicing of the film 1) is carried out. Then, when the operation is to be recommenced, the valve $V_1$ is opened, and again evacuation of the reduced-pressure sub-chambers 2a, ..., 2b and the upper vapor-deposition sub-chamber 3a is effected. If the inner pressures within the respective reduced-pressure sub-chambers 2a, ..., 2b and the upper vapor deposition sub-chamber 3a has reached desired vacuum pressures, after the lid 900 has been moved again sideways of the aperture 8a by the moving means not shown, evacuation of the lower vacuum deposition subchamber 3b is effected up to a vacuum pressure at which the aluminium 700 within the crucible 600 can evaporate, and vapor deposition is recommenced.

As will be apparent from the preceding detailed description of the preferred embodiments of the present invention, according to the present invention the following effects and advantages are obtained:

(1) In the vacuum vapor deposition system according to the present invention, since the leak gap clearances in the seal roll section can be maintained to be small, a sealing performance is improved.

(2) In addition, in the vacuum vapor deposition system according to the present invention, since the base plate is wrapped around the seal roll with a wrapping angle of 10 degrees or more, even if a little leak gas should present, fluttering of the running base plate is eliminated, and there is no possibility of creases being generated in the running base plate or the running base plate being broken.

(3) According to the present invention, it has become possible to continuously carry out vapor deposition on a paper sheet or a plastic film which could be carried out only in a batch system in the prior art. Hence, the rate of operation is greatly improved, and a production cost can be reduced to ½ to ⅓ of that in the prior art. In the case of a batch system, even in many-variety small-lot production, similar batch operations must be carried out repeatedly and hence the rate of operation of the system is poor, whereas according to the present invention a small lot and large lot can be continuously vapor-deposited by splicing. Hence, further improvement in the rate of operation can be expected according to the invention, and also schedule-freeing of production is possible. Furthermore, ease in maintenance is facilitated because the film is taken up in the atmosphere, whereby instruments can be easily provided, quality control is easy, the yield of vapor deposition material is high, and a task of removing vapor deposition materials deposited within the equipment can be reduced.

(4) If the vacuum vapor deposition system according to the present invention is employed, a far larger amount of base plates to be vapor-deposited (for instance, 300 times as large as the amount in the prior art) can be continuously subjected to metal vapor deposition than can be vapor-deposited by the system of the prior art.

Figure 7:
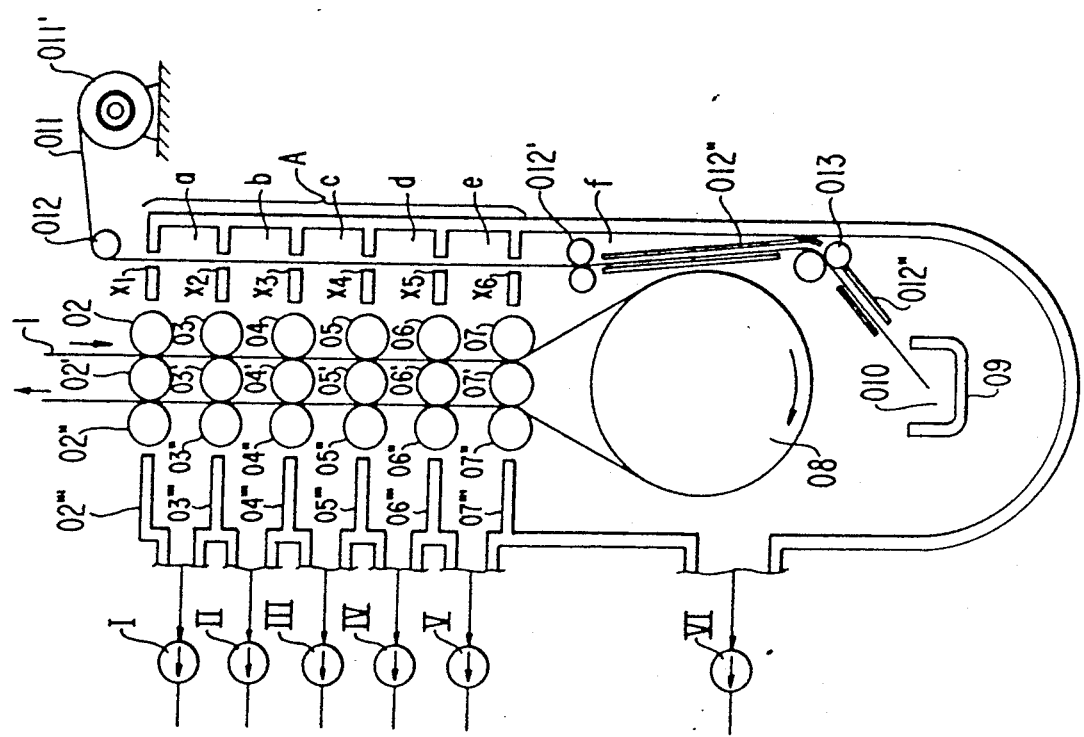
FIGS. 7 and 8 are front views respectively showing other preferred embodiments of the present invention.

(5) In addition, if the vapor deposition metal feed means in the vacuum vapor deposition system according to the present invention as shown in FIG. 7 is employed, since the cross-sectional area of the clearance between the vapor deposition metal wire made of aluminum or the like and the hole is about 1/100 times as small as the cross-sectional area of the clearance between the seal rolls or between a seal roll and the seal bar, the rate of air leakage can be disregarded, and the pressure within the vacuum vapor disposition chamber can be maintained within a pressure range where vacuum vapor deposition is possible. Accordingly, continuous feeding of vapor deposition metal such as aluminum or the like during vacuum vapor deposition becomes possible, and vacuum vapor deposition can be carried out continuously over a long period of time.

(6) According to the present invention as shown in FIG. 7, since the exposing of the crucible to the atmosphere under a high-temperature condition can be avoided, the following advantages are obtained:
  1) the shortening of the life of a crucible caused by oxidation can be avoided;
  2) the task of ladling out aluminum within the crucible is necessitated only a minimum number of times;
  3) the number of maintenance operations of the crucible is reduced; and
  4) owing to the advantages 2) and 3) above, an operation interruption period can be shortened, and productivity is improved.

While a principle of the present invention has been described above in connection with a number of preferred embodiments of the invention, it is a matter of course that many apparently widely different embodiments of the present invention can be made without departing from the spirit of the present invention.

What is claimed is:

1. A continuous vacuum vapor deposition system for depositing vapor deposition material on a continuously fed base plate under a vapor deposition process, said system comprising:
  a reduced-pressure chamber communicable with the atmosphere, and vacuum means operatively connected to said reduced-pressure chamber for reducing the pressure therein below atmospheric pressure;
  a vapor deposition chamber integral and communicating with said reduced-pressure chamber;
  a container disposed within said vapor deposition chamber at a lower portion thereof for containing deposition material to be deposited on a base plate continuously fed through the system;
  a cooling roll rotatably mounted in the system and disposed within said vapor deposition chamber at an upper portion thereof;
  a temperature-adjustable wall disposed between said container and said cooling roll and defining a rising vapor passageway through which deposition material contained in said container passes toward said cooling roll when evaporated;
  seal devices partitioning said reduced-pressure chamber into a plurality of sub-chambers,
  each of said seal devices including a set of three pinch rolls rotatably mounted in the system about respective axes of rotation and disposed parallel to one another with said axes of rotation lying in a common plane, and seal bars extending into said reduced-pressure chamber along said common plane and respectively confronting the outer two rolls of said set of three pinch rolls, a gap being defined between the center roll of said set of three pinch rolls and each of said outer two rolls, and between each of said seal bars and the outer roll which each of said seal bars confronts, in each of said seal devices, and the respective gaps between the center rolls and corresponding first ones of said outer two rolls in each of said seal devices collectively-defining an inlet through which a continuously fed base plate is able to pass to said vapor deposition chamber and the cooling roll disposed therein, and the respective gaps between the center rolls and corresponding second ones of said outer two rolls in each of said seal devices collectively defining an outlet through which a continuously fed running base plate is able to pass from said vapor deposition chamber and the cooling roll disposed therein; and a respective pair of deflector rolls rotatably mounted in the system and disposed in each of said sub-chambers, said deflector rolls positioned relative to said set of three pinch rolls in each of said sub-chambers such that a continuously fed base plate passing through said inlet, over said cooling roll and through said outlet is guided by said deflector rolls over a pinch roll of said set of three pinch rolls at said inlet and a pinch roll of said set of three pinch rolls at said outlet in each of said seal devices at a wrapping angle of at least 10°.

2. A continuous vacuum vapor deposition system as claimed in claim 1, and further comprising edge masks disposed between said cooling roll and an upper portion of said wall, said edge masks being movable in directions parallel to the axis of rotation of said cooling roll.

3. A continuous vacuum vapor deposition system as claimed in claim 1, further comprising an uncoiler for continuously feeding a base plate into the inlet defined within said reduced-pressure chamber, means operatively associated with said uncoiler for cutting and splicing a base plate, a coiler for continuously taking up a base plate passing from said reduced-pressure chamber through said outlet, and means operatively associated with said coiler for cutting and splicing a base plate.

4. A continuous vacuum vapor deposition system for depositing vapor deposition material on a continuously fed base plate under a vapor deposition process, said system comprising:

a reduced-pressure chamber communicable with the atmosphere, and vacuum means operatively connected to said reduced-pressure chamber for reducing the pressure therein below atmospheric pressure;

a vapor deposition chamber integral and communicating with said reduced-pressure chamber;

a container disposed within said vapor deposition chamber at a lower portion thereof for containing deposition material to be deposited on a base plate continuously fed through the system;

a cooling roll rotatably mounted in the system and disposed within said vapor deposition chamber at an upper portion thereof;

seal devices partitioning said reduced-pressure chamber into a plurality of sub-chambers, each of said seal devices including a set of three pinch rolls rotatably mounted in the system about respective axes of rotation and disposed parallel to one another with said axes of rotation lying in a common plane, and seal bars extending into said reduced-pressure chamber along said common plane and respectively confronting the outer two rolls of said set of three pinch rolls, a gap being defined between the center roll of said set of three pinch rolls and each of said outer two rolls, and between each of said seal bars and the outer roll which each of said seal bars confronts, in each of said seal devices, and the respective gaps between the center rolls and corresponding first ones of said outer two rolls in each of said seal devices collectively defining an inlet through which a continuously fed base plate is able to pass to said vapor deposition chamber and the cooling roll disposed therein, and the respective gaps between the center rolls and corresponding second ones of said outer two rolls in each of said seal devices collectively defining an outlet through which a continuously fed running base plate is able to pass from said vapor deposition chamber and the cooling roll disposed therein; and feeding means for feeding wire-shaped vapor deposition material from the atmosphere through said reduced-pressure sub-chambers and into said container disposed within said vapor deposition chamber.

5. A continuous vacuum vapor deposition system for depositing vapor deposition material on a continuously fed base plate under a vapor deposition process, said system comprising:

a reduced-pressure chamber communicable with the atmosphere, and vacuum means operatively connected to said reduced-pressure chamber for reducing the pressure therein below atmospheric pressure;

a vapor deposition chamber integral and communicating with said reduced-pressure chamber;

a container disposed within said vapor deposition chamber at a lower portion thereof for containing deposition material to be deposited on a base plate continuously fed through the system;

a cooling roll rotatably mounted in the system and disposed within said vapor deposition chamber at an upper portion thereof;

seal devices partitioning said reduced-pressure chamber into a plurality of sub-chambers, each of said seal devices including a set of three pinch rolls rotatably mounted in the system about respective axes of rotation and disposed parallel to one another with said axes of rotation lying in a common plane, and seal bars extending into said reduced-pressure chamber along said common plane and respectively confronting the outer two rolls of said set of three pinch rolls, a gap being defined between the center roll of said set of three pinch rolls and each of said outer two rolls, and between each of said seal bars and the outer roll which each of said seal bars confronts, in each of said seal devices, and the respective gaps between the center rolls and corresponding first ones of said outer two rolls in each of said seal devices collectively defining an inlet through which a continuously fed base plate is able to pass to said vapor deposition chamber and the cooling roll disposed therein, and the respective gaps between the center rolls and corresponding second ones of said outer two rolls in each of said seal devices collectively defining an outlet through which a continuously fed running base plate is able to pass from said vapor deposition chamber and the cooling roll disposed therein;

a partition wall partitioning said vacuum deposition chamber between said container and said cooling roll, said partition wall defining an aperture therethrough directly between said container and said cooling roll; and a lid movably mounted in the system so as to be movable over and away from said aperture to selectively open and close said aperture, said lid sealingly engaging said partition wall to effect a vacuum seal that seals said container from said reduced-pressure chamber when said lid is moved over said aperture.

6. A continuous vacuum vapor deposition system for depositing vapor deposition material on a continuously fed base plate under a vapor deposition process, said system comprising:

a reduced-pressure chamber communicable with the atmosphere, and vacuum means operatively connected to said reduced-pressure chamber for reducing the pressure therein below atmospheric pressure;

a vapor deposition chamber integral and communicating with said reduced-pressure chamber;

a container disposed within said vapor deposition chamber at a lower portion thereof for containing deposition material to be deposited on a base plate continuously fed through the system;

a cooling roll rotatably mounted in the system and disposed within said vapor deposition chamber at an upper portion thereof;

a temperature-adjustable wall disposed between said container and said cooling roll and defining a rising vapor passageway through which deposition material contained in said container passes toward said cooling roll when evaporated;

seal devices partitioning said reduced-pressure chamber into a plurality of sub-chambers, each of said devices including a single seal roll rotatably mounted in the system about an axis of rotation thereof, and seal bars extending into said reduced-pressure chamber along a plane passing through said axis of rotation and confronting said seal roll at opposite sides thereof, respectively, a gap being defined between said seal roll and said seal bars in each of said seal devices, the respective gaps between the seal rolls and corresponding first ones of said seal bars in each of said seal devices collectively defining an inlet through which a continuously fed base plate is able to pass to said vapor deposition chamber and the cooling roll disposed therein, and the respective gaps between the seal rolls and corresponding second ones of said seal bars in each of said seal devices collectively defining an outlet through which a continuously fed running base plate is able to pass from said vapor deposition chamber and the cooling roll disposed therein; and a respective pair of deflector rolls rotatably mounted in the system and disposed in each of said sub-chambers, said deflector rolls positioned relative to said set of three pinch rolls in each of said sub-chambers such that a continuously fed base plate passing through said inlet, over said cooling roll and through said outlet is guided by said deflector rolls over said seal roll at both said inlet and said outlet in each of said seal devices at a wrapping angle of at least 10°.

* * * * *